United States Patent
Matthews

(10) Patent No.: US 7,209,359 B2
(45) Date of Patent: *Apr. 24, 2007

(54) UNIVERSAL MEMORY MODULE/PCB STORAGE, TRANSPORT, AUTOMATION HANDLING TRAY

(75) Inventor: Eric Matthews, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 308 days.

This patent is subject to a terminal disclaimer.

(21) Appl. No.: 10/385,004

(22) Filed: Mar. 10, 2003

(65) Prior Publication Data

US 2003/0179554 A1 Sep. 25, 2003

Related U.S. Application Data

(63) Continuation of application No. 10/037,948, filed on Jan. 4, 2002, now Pat. No. 6,606,248.

(51) Int. Cl.
*H05K 5/00* (2006.01)

(52) U.S. Cl. .................................... 361/752

(58) Field of Classification Search ............ 361/752, 361/206, 708, 802
See application file for complete search history.

(56) References Cited

U.S. PATENT DOCUMENTS

| 647,388 | A | | 4/1900 | Evans ........................ 134/88 |
|---|---|---|---|---|
| 2,233,938 | A | | 3/1941 | Jones ........................ 220/529 |
| 3,014,594 | A | * | 12/1961 | Kerstner .................. 211/41.17 |
| 3,458,767 | A | | 7/1969 | Hedger et al. .............. 317/101 |
| 3,664,510 | A | | 5/1972 | Kerschbaum ................ 211/41 |
| 4,029,208 | A | | 6/1977 | Fickler et al. .............. 206/454 |
| 4,158,876 | A | | 6/1979 | Pedro .......................... 361/415 |
| 4,261,465 | A | * | 4/1981 | Thomas ....................... 206/708 |
| 4,527,222 | A | * | 7/1985 | Swingley, Jr. .............. 361/797 |
| 4,746,015 | A | * | 5/1988 | Kaucic ........................ 206/708 |
| 4,783,720 | A | | 11/1988 | Joist et al. .................. 361/399 |
| 4,798,305 | A | | 1/1989 | Laverty ..................... 220/22.3 |
| 5,927,504 | A | | 7/1999 | Han et al. ................... 206/706 |
| 6,109,445 | A | * | 8/2000 | Beyer ......................... 206/714 |
| 6,166,916 | A | * | 12/2000 | Jelinger ..................... 361/756 |
| 6,201,705 | B1 | | 3/2001 | Nygren et al. .............. 361/753 |
| 6,205,033 | B1 | | 3/2001 | Kelemen .................... 361/802 |
| 6,239,963 | B1 | | 5/2001 | Ulander ..................... 361/212 |
| 6,285,556 | B1 | | 9/2001 | Guth et al. ................. 361/752 |
| 6,606,248 | B2 | * | 8/2003 | Matthews ................... 361/752 |

* cited by examiner

*Primary Examiner*—Dean A. Reichard
*Assistant Examiner*—Ivan Carpio
(74) *Attorney, Agent, or Firm*—Whyte Hirschboeck Dudek SC

(57) ABSTRACT

An adjustable tray for a semiconductor device, and method of using the tray for handling the device, are provided. Each tray comprises a front frame segment and a back frame segment opposing the front frame segment, and a pair of opposing side frame segments secured to the front and back frame segments to form right angles, each side frame segment containing a longitudinal channel. Each tray further includes a fixed locator segment and an adjustable locator segment, each having a plurality of slots for receiving semiconductor devices therein. The distal ends of the locator segments are secured to the pair of opposing side frame segments at right angles. The adjustable locator segment can be manipulated such that the fixed and adjustable locator segments are spaced apart a distance commensurate with the width of the semiconductor device. The device is friction fit into a slot such that the device is only contacted at keep-out areas on the device. Using stand-offs mounted in stand-off receptacles, two or more trays can be modularly stacked.

39 Claims, 6 Drawing Sheets

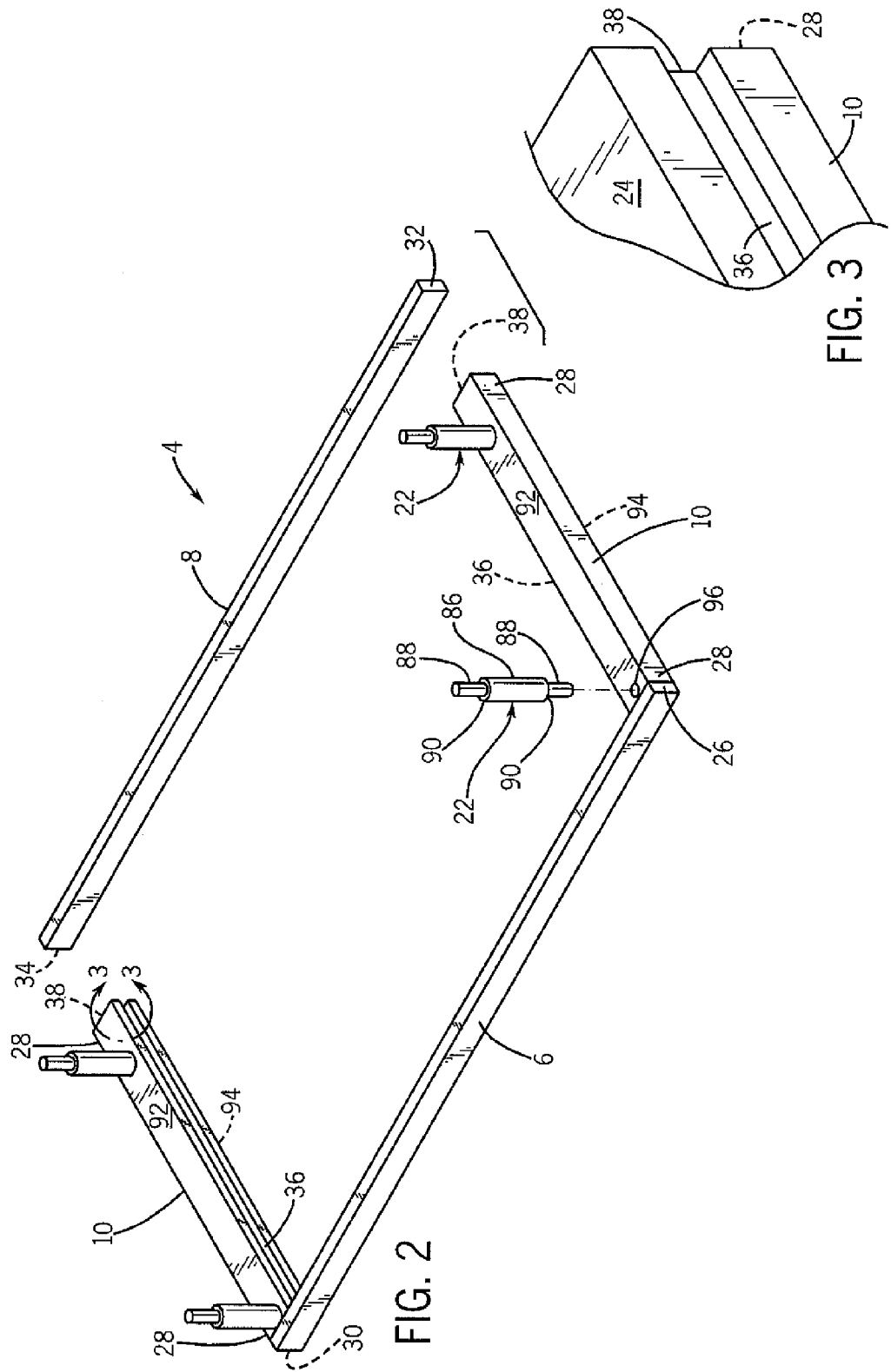

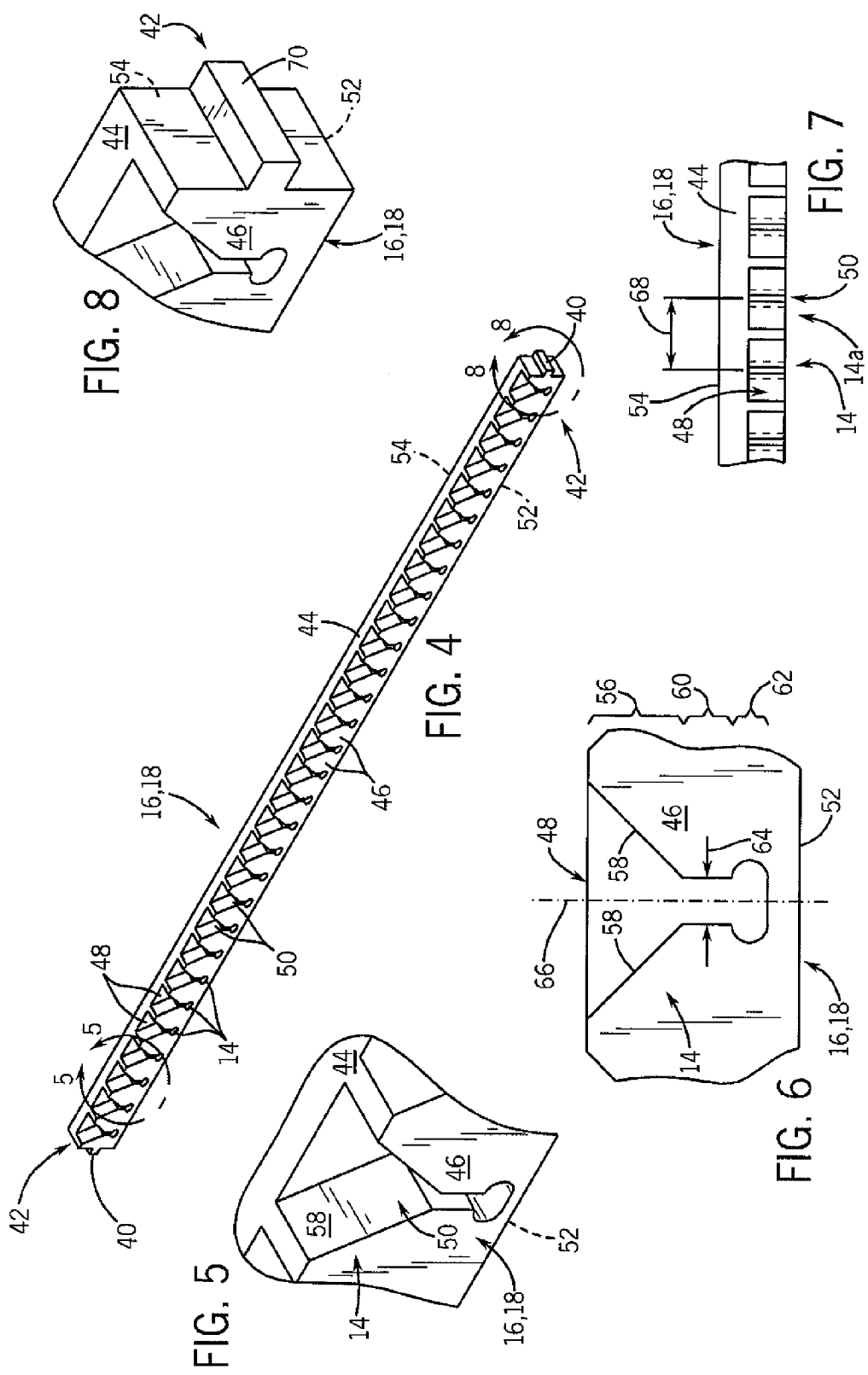

UNIVERSAL MEMORY MODULE/PCB STORAGE, TRANSPORT, AUTOMATION HANDLING TRAY

FIELD OF THE INVENTION

This invention relates in general to handling semiconductor substrate trays and, more particularly, to a modularly stackable, adjustable tray for storing, transporting, and handling a semiconductor integrated circuit device.

BACKGROUND OF THE INVENTION

Various techniques have been developed for the storing, transporting, and handling of semiconductor integrated circuit devices. Many semiconductor devices, such as printed circuit boards, are expensive and delicate. Accordingly, they must be carefully handled after processing for storage and shipment. Such boards can be fragile under loads applied to the surface of the board that typically carries components. Since such semiconductor devices are rather resistant to end loads or compression forces that act edgewise upon the board, the concept of slotted devices for holding and transporting semiconductor devices has been conventionally used.

For example, U.S. Pat. No. 3,664,510 (Kerschbaum) shows a card cage for printed circuit cards in which flexible plastic members are mounted in a metal frame to hold the printed cards in place in a vertical orientation. Further, U.S. Pat. No. 3,458,767 (Hedger) shows a rack that has opposed rows of parallel guides into which circuit boards can be slid into place. These holders are typical of the type of devices used to hold circuit boards. However, the holders are not adjustable to accommodate varying substrate sizes.

One circuit board holder having adjustable compartments is described in U.S. Pat. No. 4,158,876 (Pedro). However, Pedro requires that the circuit boards be secured by sliding opposing edges of the board through opposing elongated recesses. Such extensive contact can cause damage to components on the board. Also, since the board merely rests on a lower lip of the compartment when inserted, only the pull of gravity on the board can keep the board secure. Furthermore, the holder in Pedro is not stackable.

Given these limitations of the prior art, there is a clear need for an improved tray for storing, transporting, and handling semiconductor devices.

SUMMARY OF THE INVENTION

The present invention provides a universal memory module/printed circuit board storage, transport, and automation handling tray. In one aspect in particular, the invention comprises an adjustable tray for semiconductor devices.

In one embodiment, the semiconductor device trays comprise opposing front and back frame segments, opposing side frame segments containing a longitudinal channel, a fixed locator segment secured to the tray, and an adjustable locator segment temporarily secured to the longitudinal channel. In these embodiments, both the fixed locator segment and the adjustable locator segment comprise distal ends and slots for receiving the semiconductor devices. The distal ends have a guide element that is received by the longitudinal channels.

In one embodiment, a middle portion of the slots in the locator segments has a slot width that ensures the semiconductor device is friction fit when placed into the slots. As the semiconductor devices are received by the tray, contact between the devices and the slots is restricted to keep-out areas. As such, components on the semiconductor device do not contact the tray.

In another embodiment, the adjustable locator segment is moved with respect to the fixed locator segment such that the distance between the two segments corresponds to the width of the semiconductor device. In a further embodiment, the tray pitch present on the locator segments is greater than the aggregate thickness of the semiconductor device. In such embodiments, the tray pitch is the distance between adjacent slots on a locator segment, and the aggregate thickness is the thickness of the semiconductor device and any protruding components disposed on the device.

In yet another embodiment, the front, back, and opposing side frame segments can include stand-off receptacles. The stand-off receptacles are configured to receive and removably secure stand-offs so that a second adjustable semiconductor tray can be mounted on the stand off of a first tray. Mounting in this fashion provides vertical separation between the two (or more) adjustable semiconductor trays. In another embodiment, the opposing side frame segments provide the vertical separation. In these embodiments, the side frame segments extend upwardly from a first tray and are received by a second tray mounted on the first. The side frame segments are taller than the height of the device.

In one embodiment, the fixed locator segment is secured to the front frame segment and/or the opposing side frame segments. In another embodiment, the guide element can be a salient, a tongue, a detent, a dove-tail, a gear, a roller, a pulley, a flange, and/or a ball. In such embodiments, the longitudinal channels can contain a mating guide element that is a gear, a chain, a belt, ball bearings, and/or a lubricant.

In a further embodiment, the tray comprises a locking mechanism for temporarily securing the adjustable locator segment. In still other embodiments, the front, back, opposing side, fixed locator, and adjustable locator segments comprise one or more static dissipating materials such as Semitron ESD 225, a trademark for a static dissipative acetal.

In another embodiment of the present invention, the trays comprise opposing front and back frame segments, opposing side frame segments containing a longitudinal channel, a fixed locator segment secured to the tray, and an adjustable locator segment temporarily secured to the longitudinal channel. In these embodiments, both the fixed locator segment and the adjustable locator segment comprise distal ends and slots for receiving semiconductor devices therein. The distal ends have a guide element that is received by the longitudinal channels. When the slots receive the semiconductor devices, the devices are temporarily secured by a friction fit, and contact between a device and a slot is restricted to the keep-out areas. The keep-out areas can comprise a portion of one or more lower peripheral regions of a semiconductor device that is devoid of electrical components.

In another embodiment, the slots of the fixed locator segment and/or the adjustable locator segment can comprise slot walls with an upper portion that is tapered, rounded, or otherwise configured to assist in guiding a semiconductor device into the slot. In further embodiments, an adjustable locator segment is moveable, with respect to the fixed locator segment, to correspond to the width of the semiconductor device. In still further embodiments, when received and secured in a tray, the semiconductor devices are transverse to the tray.

In still another embodiment, the tray comprises opposing front and back frame segments and opposing adjustable locator segments. In such embodiments, each side frame segment contains a longitudinal channel and is secured to the front frame segment and/or the back frame segment. Further, the opposing adjustable locator segments comprise distal ends and slots for receiving semiconductor devices. In these embodiments, the distal ends have a guide element that is received by, and temporarily secured within, the longitudinal channel.

In yet another embodiment, the opposing adjustable locator segments are adjustable such that the distance between the opposing locator segments corresponds to the width of a semiconductor device.

Another aspect of the present invention provides a modular tray system. In one embodiment, the system comprises semiconductor devices having electrical components disposed thereon and at least two trays for receiving the devices therein. In such embodiments, the semiconductor device trays comprise opposing front and back frame segments, opposing side frame segments containing a longitudinal channel, a fixed locator segment secured to the tray, and an adjustable locator segment temporarily secured to the longitudinal channel. In these embodiments, both the fixed locator segment and the adjustable locator segment comprise distal ends and slots for receiving the semiconductor devices therein. The distal ends have a guide element that is received by the longitudinal channels. In these aspects of the system, the two (or more) adjustable semiconductor device trays are modularly stacked upon one another.

In another embodiment, the system comprises a locking mechanism for temporarily securing the two (or more) modularly stacked trays.

Another aspect of the present invention involves a method of handling one or more semiconductor devices. In one embodiment, the method comprises providing semiconductor devices having electrical components disposed thereon, providing a tray, and manipulating an adjustable locator segment in the tray such that a fixed locator segment and the adjustable locator segment are spaced apart a distance commensurate with the thickness of the semiconductor devices. Then, the semiconductor devices are inserted into the tray with a friction fit. Thereafter, one or more additional trays can be provided and modularly stacked after having received semiconductor devices. In a further embodiment, the adjustable locator segment is manipulated (or moved) by a person. In still further embodiments, the manipulating, inserting, and securing acts can at least partially be performed in an automated, computer controlled process.

In another embodiment, method comprises processing semiconductor devices using an adjustable tray. In one embodiment, the method comprises determining the thickness, the aggregate thickness, and the width of a semiconductor device and selecting two locator segments based on these determined measurements. In these embodiments, each of the slots disposed within the fixed and/or adjustable locator segments has a slot width smaller than the thickness of the semiconductor device. Further, adjacent slots disposed within the fixed and/or adjustable locator segments have a tray pitch larger than the aggregate thickness of the semiconductor device. Thereafter, the two locator segments are inserted into a frame assembly by aligning guide elements on the locator segments with opposing channels in side frame segments in the frame assembly. The guide elements are then urged forward into the opposing channels of the side frame segments. The back frame member of the tray is then secured to the frame assembly. The two locator segments are adjusted such that the distance between the two locator segments corresponds with the width of semiconductor devices. The semiconductor devices are then secured in the slots by inserting keep-out areas of the semiconductor devices into the slots to create a friction fit.

In another embodiment, the method further comprises inserting stand-offs into stand-off receptacles that are disposed on the frame assembly such that one or more adjustable semiconductor trays can be modularly stacked. In another embodiment, each slot in the fixed and/or adjustable locator segment comprises opposing slot walls that produce a fiction fit when the semiconductor device is inserted between the walls of the slot.

BRIEF DESCRIPTION OF THE DRAWINGS

Embodiments of the invention are described below with reference to the following accompanying drawings, which are for illustrative purposes only. The invention is not limited in its application to the details of construction or the arrangement of the components set forth in the following description or illustrated in the drawings. The invention is capable of other embodiments or of being practiced or carried out in other various ways. Also, it is to be understood that the terminology and phraseology employed herein is for purpose of description and illustration and should not be regarded as limiting. Like reference numerals are used to indicate like components.

FIG. 2 is a perspective view (partially exploded) of the frame assembly and stand-offs of the tray of FIG. 1.

FIG. 3 is a perspective view of the longitudinal channel in each side frame segment in the frame assembly of FIG. 2.

FIG. 4 is a perspective view of a locator segment in the tray of FIG. 1 illustrating a plurality of slots.

FIG. 5 is a perspective view of a slot disposed within the locator segment of FIG. 4.

FIG. 6 is a front, elevational view of the slot of FIG. 5 illustrating the slot thickness and longitudinal axis.

FIG. 7 is a top, plan view of a portion of the locator segment of FIG. 4 illustrating the tray pitch.

FIG. 8 is a perspective view of an end of the locator segment of FIG. 4.

DETAILED DESCRIPTION OF THE PREFERRED EMBODIMENT

The invention will be described generally with reference to the drawings for the purpose of illustrating the present preferred embodiments only and not for purposes of limiting the same.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above. As used herein, the terms "front", "back", "top", and "bottom" are used for illustrative purposes only and are not meant to limit the description of the invention in any way.

In the illustrated example, a semiconductor device known as a printed circuit board (PCB) will be used to describe the invention, although other conventional semiconductor devices known in the microelectronics or semiconductor industry can be used in connection with the described tray.

Figure 1:
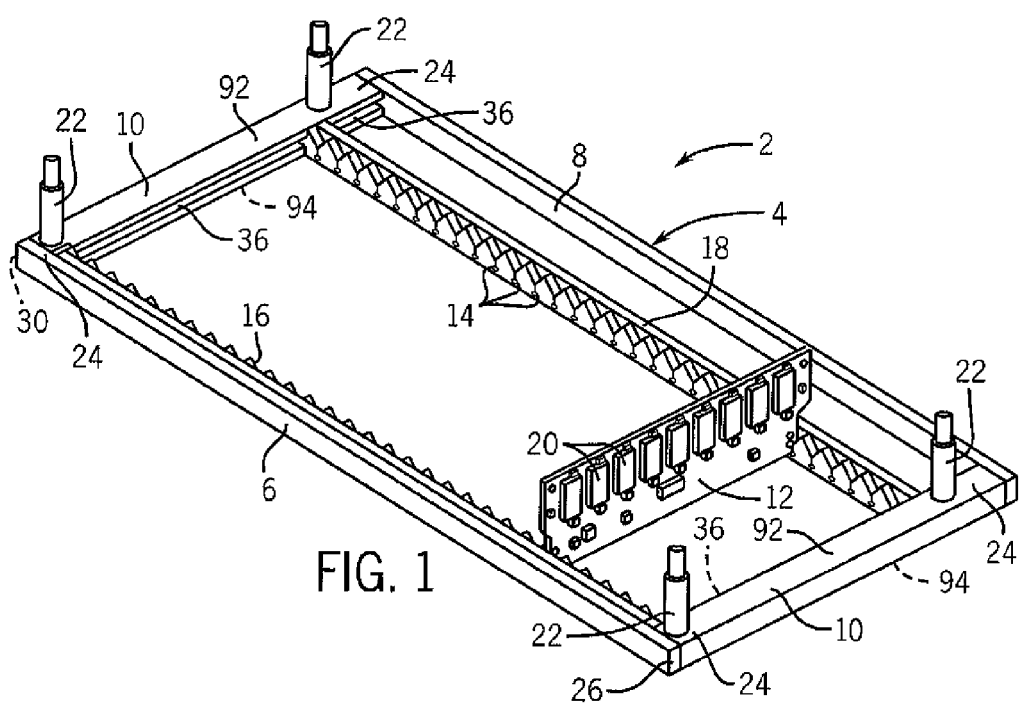
FIG. 1 is a perspective view of an embodiment of an adjustable, modularly stackable tray with a semiconductor device secured therein according to the invention.

Referring to FIG. 1, an embodiment of an adjustable, modularly stackable tray 2 according to the invention is illustrated. The tray 2, comprising a frame 4 constructed of frame segments 6, 8, 10, is shown securing a semiconductor device 12 within the slots 14 of locator segments 16, 18. The semiconductor device 12, bearing several attached electrical components 20, is vertically oriented with respect to the horizontally oriented tray 2. Also, FIG. 1 illustrates a plurality of stand-offs 22 located proximate corners 24 of the tray 2.

Frame 4, employed by tray 2 in FIG. 1, is depicted partially assembled and in more detail in FIG. 2. As FIG. 2 shows, frame 4 comprises a first (front) frame segment 6, a second (back) frame segment 8, and a pair of opposing side frame segments 10. Each of these four segments 6, 8, 10 will be secured together to erect frame 4. As shown, an end 28 of one side frame segment 10 is secured to front frame segment 6 proximate a first end 26 of front frame segment. Similarly, an end 28 of opposing side frame segment 10 is secured to front frame segment 6 proximate a second end 30 of the front frame segment. Thus, three of the segments 6, 10 of frame 4 are secured together.

Figure 9:
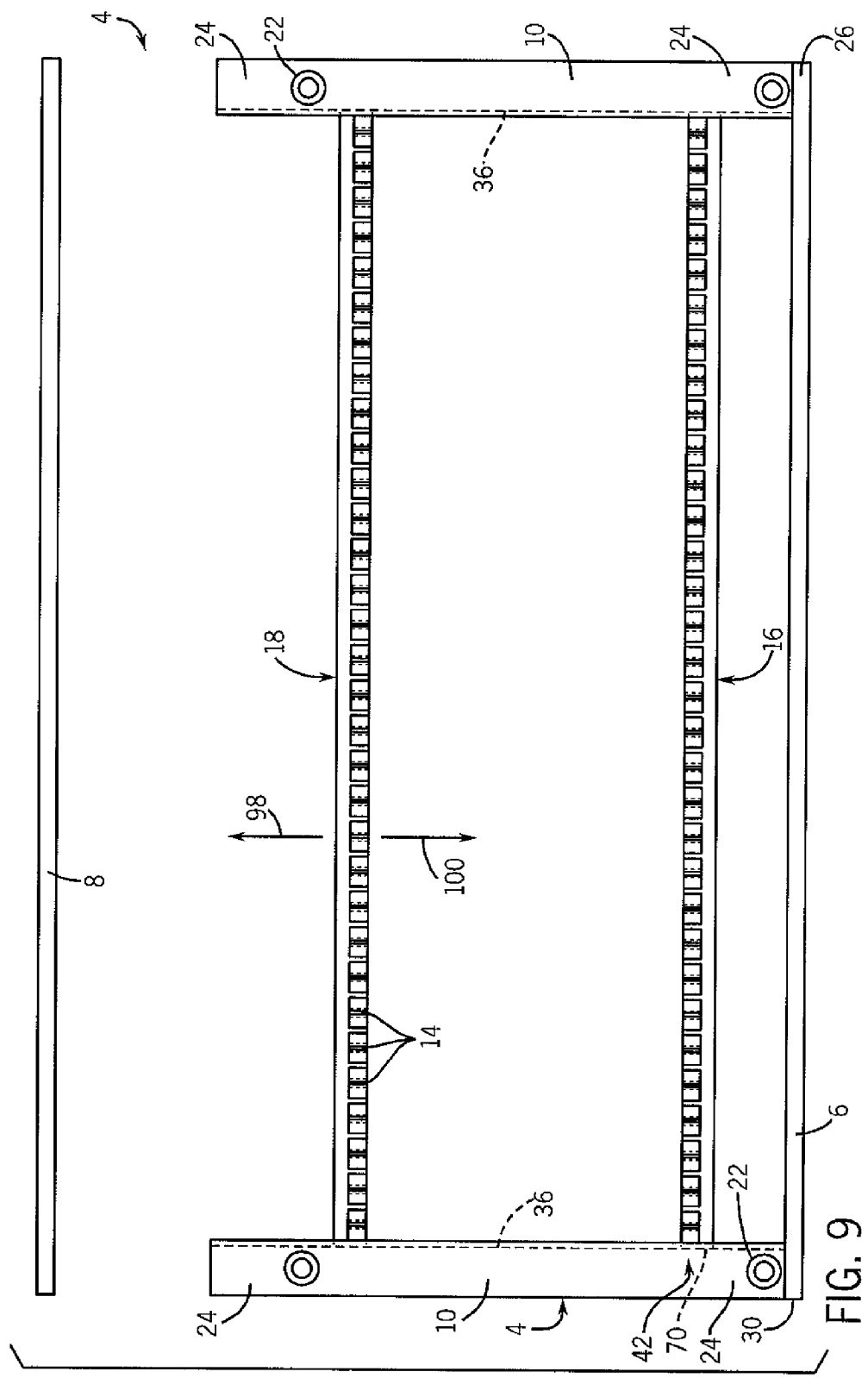
FIG. 9 is a top, plan view (partially exploded) of the frame assembly of FIG. 2 illustrating locator segments (FIG. 4) within the frame assembly.

Back frame segment 8 is illustrated prior to being secured to the remaining segments 6, 10. Back frame segment 8, like front frame segment 6, will eventually be secured to the ends 28 of opposing side segments 10 to complete frame 4. An end 28 of one side frame segment 10 will be secured to back frame segment 8 proximate a first end 32 of the back frame segment. Likewise, another end 28 of an opposing side frame segment 10 will be secured to back frame segment 8 proximate a second end 34 of the back frame segment. As such, when frame 4 is assembled, front and back frame segments 6, 8 oppose each other. The four joined segments 6, 8, 10 form right angles when positioned in a common, horizontal plane. Typically, when perceived from a top plan view such as shown in FIG. 9, the combination of segments 6, 8, 10 takes the shape of a square or rectangle. Each of the segments 6, 8, 10 can be constructed by a machining or molding technique, such as vacuum molding, and are typically made from a static dissipating material such as Semitron ESD 225, ABS plastic (carbon impregnated), and the like.

Each side frame segment 10 contains a longitudinal channel 36 therein as illustrated in FIG. 3. The longitudinal channel 36 typically extends within the entire length of a side frame segment 10, although the channel can be limited to a portion of the length. However, at least one end 28 of a side frame segment 10 provides an end channel opening 38. The end 28 with the end channel opening 38 is preferably disposed towards back frame segment 8. Referring back to FIG. 2, when frame 4 of tray 2 is assembled, the channel 36 found within each side frame segment 10 faces inwardly. Thus, the channels 36 on opposing side frame segments 10 face and oppose each other.

One of the two similar locator segments 16, 18 of FIG. 1 is depicted in detail in FIG. 4. Like frame segments 6, 8, 10, locator segments 16, 18 can be constructed by a machining or molding technique and are typically made from a static dissipating material such as Semitron ESD 225. Locator segments 16, 18 each comprise an elongate member, containing a plurality of slots 14 therein, having a guide element 40 proximate each end 42. As FIG. 4 illustrates, slots 14 within locator segments 16, 18 are arranged substantially along the entire length of the locator segments. Furthermore, the slots 14 open toward a top surface 44 and are disposed toward a front surface 46 of the locator segments 16, 18 such that each slot 14 comprises a top surface opening 48 and a front surface opening 50. The slots 14 are shown in greater detail in FIGS. 5–7.

As illustrated in FIG. 5, slots 14 have a top surface opening 48 on the top surface 44 of locator segments 16, 18 and extend downwardly toward the bottom surface 52 of the locator segments. Typically, slots 14 do not penetrate bottom surface 52 of locator segments 16, 18. Likewise, slots 14 have a front surface opening 50 on the front surface 46 of locator segments 16, 18 and extend inwardly toward back surface 54 of the locator segments. Again, typically slots 14 do not penetrate back surface 54 of the locator segments 16, 18. In one embodiment, as illustrated in FIGS. 5 and 6, an upper portion 56 of slot 14 has slot walls 58 that are tapered from the top surface 44 towards the bottom surface 52 until the slot walls reach a middle portion 60 of the slot. In other embodiments, the slot walls 58 at the upper portion can be rounded, concave, convex, funnel-shaped, conical or the like to guide the device 12 into slot 14. At middle portion 60, opposing slot walls 58 become vertically oriented and again extend towards the bottom surface 52 until reaching a lower portion 62 of slot 14. At the middle portion 60 of slot 14, as illustrated in FIG. 6, the distance between opposing slot walls 58 defines a slot width 64. Lower portion 62 of slot 14 can be expanded and become hemispherical or similarly shaped.

As further illustrated in FIG. 6, each slot 14 has a longitudinal axis 66. The distance between the longitudinal axis 66 of adjacent slots 14, 14a, defines a tray pitch 68 as illustrated in FIG. 7. In one embodiment, the tray pitch 68 between adjacent slots 14, 14a on the locator segments 16, 18 is kept constant over the entire length of the locator segment. However, tray pitch 68 can be varied over the length of the locator segments 16, 18, as desired.

Referring to FIG. 8, the locator segments 16, 18 further comprise a guide element 70 proximate each end 42 of the locator segments. Guide element 70 typically comprises a protruding portion of, or addition to, end 42 of locator segments 16, 18. In the embodiment shown in FIG. 8, guide element 70 is illustrated as a protruding salient. The protruding salient guide element 70 is configured to correspond to, and fit within, channels 36 of side frame segments 10. As such, frame 4 can receive one or more locator segments 16, 18 within channels 36 when guide elements 70 on ends 42 of the locator segments are aligned with the channels in the side frame segments 10. In other embodiments, the guide element 70 can comprise, for example, a detent, a tongue, a dove-tail, a gear, a roller, a pulley, a flange, or a ball. In such embodiments, channel 36 will generally contain therein, for example, a gear, a chain, a belt, ball bearings, a lubricant, or other mating guide element (not shown) to complimentarily and correspondingly receive the particular selected guide element 70.

FIG. 9 illustrates two locator segments 16, 18 as received by partially assembled frame 4. Guide element 70 on each end 42 of locator segments 16, 18 is aligned with, and inserted into, channel 36 of each opposing side frame segment 10. The locator segments 16, 18 are then slid along channels 36 and into position inside frame 4. In one embodiment, one locator segment 16 is fixed while the other locator segment 18 is adjustable. As shown in FIG. 1, back surface 54 of fixed locator segment 16 can be secured to front frame segment 6. In other embodiments, the ends 42 of the fixed locator segment 16 can be secured to opposing side frame segments 10 at or near front frame segment 6 as illustrated in FIG. 9.

Adjustable frame locator segment 18 can be moved, via guide elements 70 within channels 36, toward or away from fixed locator segment 16 as shown by directional arrows 98, 100. As such, the distance between locator segments 16, 18 can be increased or decreased as desired. A locking mechanism (not shown) such as a set screw, a spring-loaded pin, and the like, attached to opposing side frame segments 10 can be employed to temporarily secure the adjustable locator segment 18 in a particular location once a desired position is achieved.

In another embodiment, both locator segments 16, 18 are adjustable. Such an arrangement provides an increased ability to situate locator segments 16, 18 within the tray and relative to one another. Also, by using two adjustable locator segments 16, 18, semiconductor devices 12 secured therein can be centered within tray 2 to bolster the stability of the tray.

Figure 10:
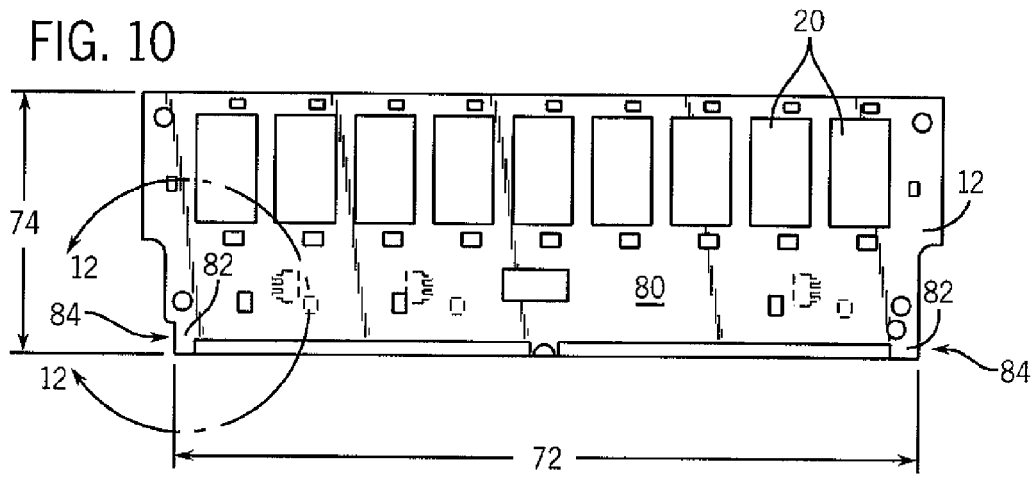
FIG. 10 is a front, elevational view of an embodiment of a semiconductor device for insertion into the tray of FIG. 1.
Figure 11:
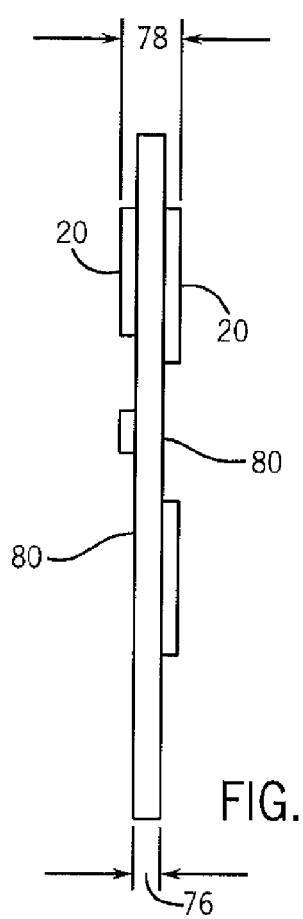
FIG. 11 is a side, elevational view of the semiconductor device of FIG. 10.

An embodiment of a semiconductor device 12 with attached components 20 is illustrated in greater detail in FIG. 10. As shown, device 12 has a known and measurable width 72 and height 74. Also, FIG. 11 illustrates the semiconductor device 12 in profile where the device has a known and measurable thickness 76. Furthermore, the device 12 has an aggregate (total) thickness 78 defined by the thickness of the device 12 including the electrical components 20 disposed thereon. Electrical components 20 can protrude from a semiconductor device surface 80. Therefore, the thickness of the components on the surface of the device is accounted for in determining aggregate thickness 78.

Figure 12:
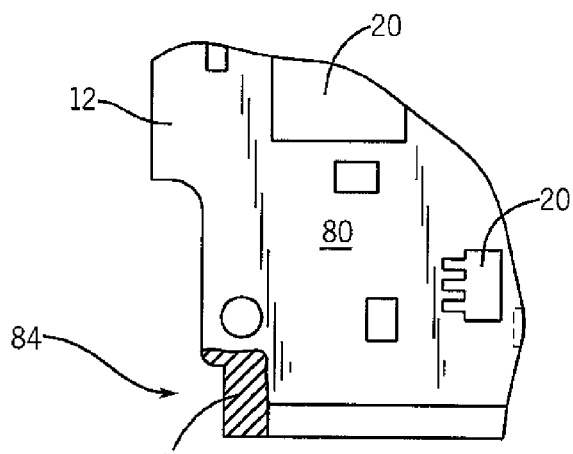
FIG. 12 is a cut-away portion of the semiconductor device of FIG. 10, highlighting the keep-out area on the semiconductor device.

Referring to FIG. 12, semiconductor device 12 further comprises keep-out areas 82. Keep-out areas 82, which are highlighted in FIG. 12 by diagonal hatching, typically occur proximate the lower, peripheral regions 84 of device 12. The keep-out areas 82 are so named because the keep-out areas are devoid of any electrical components 20 or other fragile semiconductor elements (not shown) that can be easily damaged during the handling of the device. Thus, if physical contact with device 12 is required, it is preferred that the contact be limited to keep-out areas 82 to ensure the integrity of the device and any device components.

Referring back to FIGS. 1 and 2, a plurality of stand-offs 22 are illustrated. Each stand-off 22 comprises an elongate member having a central portion 86, with a larger diameter, and distal end portions 88, with smaller diameters, thereby creating circumferential shoulders 90. Although a cylindrical stand-off 22 is illustrated, the stand-offs can take a variety of different shapes. Central portion 86 can be comprised of a variety of lengths, however, the central portion is preferably greater than the height 74 of the semiconductor device 12 to facilitate modular stacking while avoiding damage to the device. Within both the top 92 and the bottom 94 of each side frame segment 10, a plurality of stand-off receptacles 96 are illustrated. The stand-off receptacles 96 can be generally located near ends 28 of the opposing side frame segments. Each of the stand-off receptacles 96 is configured to receive a stand-off 22, the stand-off being received by the stand-off receptacle until penetration is halted by the circumferential shoulder 90. By utilizing a plurality of stand-offs 22 in combination with stand-off receptacles 96, one or more trays 2 can be modularly stacked.

In another embodiment, a pair of upwardly, and vertically extending, opposing side frame segments (not shown) can be utilized instead of stand-offs 22 and stand-off receptacles 96. The height of side frame segments in these embodiments is preferably greater than the device height 74 to facilitate modular stacking while avoiding damage to the device. In such embodiments, bottom 94 of side frame segments 10 would receive a portion of top 92 of side frame segments from an additional tray. In another embodiment, each of the front, back, and opposing side frame segments 6, 8, 10 can contain therein a plurality of stand-off receptacles 96 (not shown).

With the components of the tray outlined, an embodiment of a method of using the tray according to the invention can be articulated. The semiconductor device 12 to be stored, handled, transported, or otherwise processed is selected. Thereafter, the thickness 76 of device 12 is determined. The aggregate thickness 78 of device 12 and any components 20 is then determined. Next, appropriate locator segments 16, 18 are selected based on thickness 76 and aggregate thickness 78. As an example, an appropriate locator segment is one where slot width 64 is slightly smaller than device thickness 76 and tray pitch 68 is slightly larger than aggregate thickness 78.

After locator segments 16, 18 are selected, the segments are introduced into the partially assembled frame 4 as depicted in FIG. 9. Guide elements 70 on each end of locator segments 16, 18 are aligned with channels 36 in opposing side frame segments 10. Upon alignment, guide elements 70 are inserted into the channels 36. Thereafter, back frame segment 8 is secured to remaining frame segments 6, 10 to form frame 4 of tray 2.

The semiconductor device 12 is examined and device width 72 is ascertained. Generally, as shown in FIG. 10, the device width 72 is measured from one lower peripheral region 84 to another. Notably, the keep-out areas 82 are located within these lower peripheral regions 84 to ensure that no components 20 or other fragile parts are near where device 12 and tray 2 contact each other. After device width 72 is determined, one (or more locator segments 16, 18 are adjusted as needed to correspond to the width. Preferably, the one or more locator segments 16, 18 are manipulated until the distance between the locator segments is substantially equal to device width 72. After an appropriate distance has been established, one or more of locator segments 16, 18 are secured in that position.

With locator segments 16, 18 positioned and secured, tray 2 is ready to accept the insertion of semiconductor device 12. To commence insertion, the keep-out areas 82 found in the lower peripheral regions 84 of a vertically oriented device 12 are aligned with a corresponding pair of slots 14 on opposing locator segments 16, 18 in a horizontally oriented tray 2. With the distance between locator segments 16, 18 having been determined with respect to width 72, alignment can be easily accomplished. Keep-out areas 82 are guided into slots 14 at top surface slot openings 48 while tapered upper portions 56 of the slots assist in sliding and positioning, or funneling, device 12 toward the middle portion 60 of the slots. As keep-out areas 82 pass into middle portion 60 of slots 14, a friction fit of device 12 in slot 14 is accomplished. This result transpires because each slot width 64 is slightly smaller than the device thickness 76. Device 12 continues to be urged into each slot 14 until the device completely extends through lower portion 62 of each slot. Thus, only keep-out areas 82 of device 12 are contacted as a friction fit is accomplished and the device is secured in tray 2.

Figure 13:
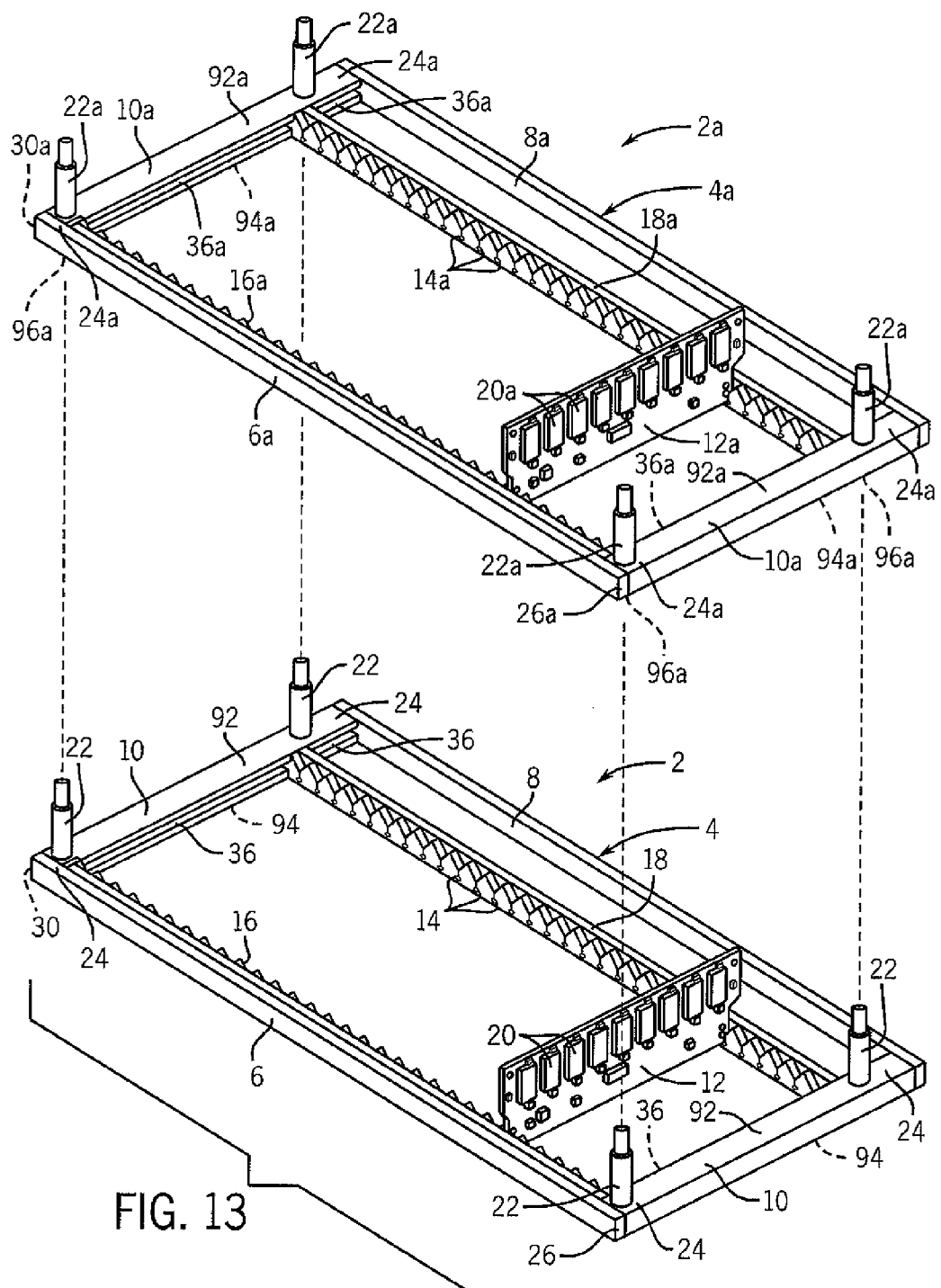
FIG. 13 is a perspective view (exploded) of an additional adjustable, modularly stackable tray being stacked upon the tray of FIG. 1.

As one or more devices 12 are secured in a tray 4, it may become desirable to enlist additional trays 4a as illustrated in FIG. 13. For example, where a dimension 72, 74, 76, 78 of device 12 changes, or where tray 4 is filled with semiconductor devices, the use of additional trays 4a may become desirable. However, dealing with these extra trays 4a can make transportation, storage, or handling cumbersome if the trays are not sufficiently managed. Preferably, trays 4, 4a can be modularly stacked. To stack trays 4, 4a, a plurality of stand-offs 22 are inserted into stand-offs receptacles 96 located on top 92 of an opposing side frame segment 10 in tray 4. Center portion 86 of stand-off 22 preferably exceeds height 74 of device 12 so that damage to the device does not occur upon stacking. When completely inserted, shoulders 90 of stand-offs 22 will be in contact with top 92. Thereafter, the stand-off receptacles 96a on the bottom 94a of an additional tray 4a are aligned with stand-offs 22 extending upwardly from the first tray 4. The additional tray 4a is then lowered such that the stand-offs 22 on the first tray 4 are received by stand-off receptacles 96a on the additional tray 4a. When completely inserted, shoulders 90 of stand-offs 22 will be in contact with the bottom 94a of additional tray 4a. As this process is repeated, multiple additional trays can be modularly stacked.

Despite the above step being outlined in a step-by-step sequence, the completion of the acts in a particular chronological order is not mandatory. Several of the acts can be undertaken and accomplished at different times to achieve a tray according to the invention.

In compliance with applicable statutes, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An adjustable tray for a semiconductor device, comprising: a front segment and opposing back segment being spaced apart; a first side segment and opposing second side segment being spaced apart and secured to the front and back segments to form a frame, at least one side segment comprising a longitudinal channel extending a length of said side segment; and a first locator segment and opposing second locator segment being spaced apart and structured to cooperate for supporting a semiconductor device in a perpendicular orientation therebetween, at least one locator segment comprising a distal end having a guide element engaged with the longitudinal channel for slidably moving said locator segment along a length of the longitudinal channel.

2. The adjustable tray of claim 1, wherein the frame is substantially rectilinear.

3. The adjustable tray of claim 1, wherein each of the side segments comprise a longitudinal channel along the length of the side segment, with a slidably-moveable element of said locator segment engage with each of said channels.

4. The adjustable tray of claim 1, wherein each of the locator segments comprise a slidably-moveable element engaged with the longitudinal channel.

5. The adjustable tray of claim 1, wherein each of the side segments comprise a longitudinal channel along the length of the side segment, with a slidably moveable element of each of the locator segments engaged with each of said channels.

6. The adjustable tray of claim 1, wherein the one or more locator segments are removably secured to the frame.

7. The adjustable tray of claim 1, wherein each of the locator segments are slidably engaged with the channel.

8. The adjustable tray of claim 1, wherein the locator segments comprises one or more slots for receiving the semiconductor device therein.

9. The adjustable tray of claim 8, wherein the one or more slots on the locator segments oppose one another for aligning the semiconductor device.

10. The adjustable tray of claim 1, wherein the guide element is selected from a group consisting of a salient a tongue, a detent a dove-tail, a gear, a roller, a pulley, a flange, and a ball.

11. The adjustable tray of claim 1, wherein the longitudinal channel comprises a mating guide element for receiving the guide element therein.

12. The adjustable tray of claim 11, wherein the mating guide element is selected from the group consisting of a gear, a chain, a belt, ball bearings, and a lubricant.

13. An adjustable tray for a semiconductor device, comprising: a front segment and an opposing back segment being spaced apart; a first side segment and opposing second side segment being spaced apart and secured to the front and back segments to form a frame, at least one side segment comprising a longitudinal channel extending a length of said side segment; and a first locator segment and opposing second locator segment being spaced apart and structured to cooperate for supporting a semiconductor device in a perpendicular orientation therebetween, at least one locator segment comprising a distal end having an element removably engaged with the longitudinal channel and slidably moveable along a length of the longitudinal channel; and an element structured for stacking an additional tray thereon.

14. The adjustable tray of claim 13, wherein the element for stacking the additional tray comprises one or more stand-offs situated on the frame of the adjustable tray.

15. The adjustable tray of claim 13, wherein the element for stacking the additional tray comprises one or more receptacles situated on the frame of the adjustable tray for matingly receiving stand-offs situated on the additional tray.

16. The adjustable tray of claim 13, wherein the element for stacking is situated on the front and back segments, the side segments, the locator segments, or a combination thereof.

17. The adjustable tray of claim 13, further comprising:
a locking mechanism for releasably securing said additional tray in a fixed position.

18. An adjustable tray for a semiconductor device, comprising: opposing front and back segments; opposing side segments secured to the front and back segments to form a frame, at least one side segment comprising a longitudinal channel extending a length of said side segment; opposing locator segments structured to cooperate for supporting a semiconductor device in a perpendicular orientation therebetween, at least one locator segment comprising a distal end having an element removably engaged with the longitudinal channel and slidably moveable along a length of the longitudinal channel, at least one of the locator segments being moveable relative to the side segments.

19. The adjustable tray of claim 18, wherein both of the locator segments are moveable relative to the side segments.

20. An adjustable tray for a semiconductor device, comprising: opposing front and back segments; opposing side segments secured to the front and back segments to form a frame, at least one side segment comprising a longitudinal channel extending a length of said side segment; a first locator segment and opposing second locator segment structured to cooperate for supporting a semiconductor device in a perpendicular orientation therebetween, the first locator segment comprising a distal end having an element removably engaged with the longitudinal channel within said side segment and slidably moveable along a length of the longitudinal channel, and the second locator segment being fixedly attached to at least one of the side segments.

21. A modular tray system, comprising:
(i) two or more stacked adjustable trays, each adjustable tray comprising:
opposing front and back segments; opposing side segments secured to the front and back segments to form a frame, at least one side segment comprising a longitudinal channel extending a length of said side segment; and a first locator segment and opposing second locator segment structured for supporting a semiconductor device in a perpendicular orientation therebetween, the first locator segment comprising an element removably engaged with the longitudinal channel within said side segment and slidably moveable along a length of the longitudinal channel; and (ii) an element situated on at least one of said adjustable trays and structured for maintaining the two or more trays in a stacked arrangement.

22. The modular tray system of claim 21, wherein the stacking element comprises one or more stand-offs.

23. The modular tray system of claim 22, wherein the element for stacking comprises one or more receptacles situated on the frame of one of the adjustable trays for matingly receiving stand-offs situated on the other of the adjustable trays.

24. The modular tray system of claim 21, wherein the element for stacking comprises a vertical extension of the side segments of one or both of the adjustable trays having standoffs situated thereon.

25. The modular tray system of claim 21, wherein the element for stacking is situated on the front and back segments, the side segments, the first and second locator segments, or a combination thereof.

26. The modular tray system of claim 21, further comprising:
a locking mechanism for releasably securing the stacked trays-in a fixed position.

27. A tray for supporting a semiconductor device, comprising: a frame comprising opposing front and back segments and opposing side segments, the side segments having a length, and at least one side segment comprising a channel extending the length of said side segment; and opposing locator segments secured to the side segments in a spaced apart arrangement, with one of the locator segments being slidably engaged with the channel by an element situated at a distal end of said locator segment, the locator segments structured to cooperate to support a semiconductor device in a perpendicular orientation therebetween.

28. A tray for supporting a semiconductor device, comprising: a frame comprising opposing front and back segments and opposing side segments, the side segments having a length, and at least one side segment comprising a channel extending the length of said side segment; and opposing locator segments secured to the side segments in a spaced apart arrangement, with one of the locator segments being slidably en a ed with the channel by an element situated at a distal end of said locator segment, and the other of the locator segments fixedly attached to at least one of the side segments, the locator segments structured to cooperate to support a semiconductor device in a perpendicular orientation therebetween.

29. A tray for supporting a semiconductor device, comprising: a frame comprising opposing front and back segments and opposing side segments, the side segments having a length, and at least one side segment comprising a channel extending the length of said side segment; and opposing locator segments secured to the side segments in a spaced apart arrangement, with one of the locator segments fixedly attached to at least one of the side segments, and the other of the locator segments comprising a distal end having a guide element slidably engaged with the channel, the locator segments structured to cooperate to support a semiconductor device in a perpendicular orientation therebetween.

30. The tray of claim 29, wherein the guide element comprises a flange situated within the channel.

31. The tray of claim 29, wherein the guide element comprises a ball situated within the channel.

32. The tray of claim 29, further comprising a locking mechanism for releasably securing the guide element in a fixed position.

33. The tray of claim 29, further comprising a plurality of stand-offs situated on the frame.

34. The tray of claim 29, further comprising a plurality of elements situated on the frame and structured for receiving a stand-off therein.

35. A stacked tray system, comprising: two or more adjustable trays structured for supporting a semiconductor device in a perpendicular orientation, the trays in a stacked arrangement, and each adjustable tray comprising: a frame comprising opposing front and back segments and opposing side segments, the side segments having a length, and at least one side segment having a channel extending the length of said side segment; opposing locator segments secured to the side segments in a spaced apart arrangement, with one of the locator segments being slidably engaged with the channel; and an element situated on at least one of said adjustable trays and structured for maintaining the two or more trays in a stacked arrangement.

36. A stacked tray system, comprising: two or more adjustable trays structured for supporting a semiconductor device in a perpendicular orientation, the trays in a stacked arrangement, and each adjustable tray comprising: a frame comprising opposing front and back segments and opposing side segments, the side segments having a length, and at least one side segment having a channel extending the length of said side segment; opposing locator segments secured to the side segments in a spaced apart arrangement, with one of the locator segments being slidably engaged with the channel; and an element situated on at least one of said adjustable trays and structured for maintaining a spaced apart arrangement between the semiconductor device situated within a lower tray and the frame of an upper tray stacked on the lower tray.

37. The system of claim 36, further comprising a lacking mechanism for releasably securing the stacked trays in a fixed position.

38. A stacked tray system, comprising: two or more adjustable trays structured for supporting a semiconductor device in a perpendicular orientation, the trays in a stacked arrangement, and each adjustable tray comprising: a frame comprising opposing front and back segments and opposing side segments, the side segments having a length, and at least one side segment having a channel extending the length of said side segment; opposing locator segments secured to the side segments in a spaced apart arrangement, with one of the locator segments being slidably engaged with the channel; and a plurality of stand-offs situated on at least one of said adjustable trays and structured for maintaining a spaced apart arrangement between the semiconductor device situated within a lower tray and the frame of an upper tray stacked on the lower tray.

39. A stacked tray system, comprising: two or more adjustable trays structured for supporting a semiconductor device in a perpendicular orientation, the trays in a stacked arrangement, and each adjustable tray comprising: a frame comprising opposing front and back segments and opposing side segments, the side segments having a length, and at least one side segment having a channel extending the length of said side segment; opposing locator segments secured to the side segments in a spaced apart arrangement, with one of the locator segments being slidably engaged with the channel; and the side segments of a lower tray having a height effective to maintain a spaced apart arrangement between the semiconductor device situated within the lower tray and the frame of an upper tray stacked on the lower tray.

* * * * *

UNITED STATES PATENT AND TRADEMARK OFFICE
CERTIFICATE OF CORRECTION

PATENT NO. : 7,209,359 B2
APPLICATION NO. : 10/385004
DATED : April 24, 2007
INVENTOR(S) : Eric Matthews Page 1 of 1

It is certified that error appears in the above-identified patent and that said Letters Patent is hereby corrected as shown below:

Column 8, line 45: Replace "(or" with --or--.
Column 9, line 64: Replace "engage" with --engaged--.
Column 12, line 1: Replace "en g ed" with --engaged--.
Column 12, line 59: Replace "lacking" with --locking--.

Signed and Sealed this

Tenth Day of July, 2007

JON W. DUDAS
*Director of the United States Patent and Trademark Office*